United States Patent
Dodeja et al.

(10) Patent No.: US 8,839,061 B2
(45) Date of Patent: Sep. 16, 2014

(54) SYSTEM AND METHOD FOR SCAN CHAIN RE-ORDERING

(71) Applicants: Puneet Dodeja, Delhi (IN); Vishal Gupta, Noida (IN); Manish Kumar Mittal, Noida (IN)

(72) Inventors: Puneet Dodeja, Delhi (IN); Vishal Gupta, Noida (IN); Manish Kumar Mittal, Noida (IN)

(73) Assignee: Freescale Semiconductor, Inc.

( * ) Notice: Subject to any disclaimer, the term of this patent is extended or adjusted under 35 U.S.C. 154(b) by 119 days.

(21) Appl. No.: 13/762,344

(22) Filed: Feb. 7, 2013

(65) Prior Publication Data

US 2014/0223249 A1    Aug. 7, 2014

(51) Int. Cl.
*G01R 31/28*       (2006.01)
*G01R 31/3177*     (2006.01)

(52) U.S. Cl.
CPC ................................. *G01R 31/3177* (2013.01)
USPC .......................................... 714/729; 714/727

(58) Field of Classification Search
CPC ............... G01R 31/318544; G01R 31/318583; G01R 31/318547; G01R 31/2815
USPC ........... 716/136; 714/726, 738, 732, 729, 727
See application file for complete search history.

(56) References Cited

U.S. PATENT DOCUMENTS

| | | | |
|---|---|---|---|
| 5,544,174 A * | 8/1996 | Abend ............................ | 714/726 |
| 6,434,733 B1 | 8/2002 | Duggirala et al. | |
| 6,539,509 B1 | 3/2003 | Teene | |
| 6,615,380 B1 * | 9/2003 | Kapur et al. .................... | 714/738 |
| 6,907,594 B2 | 6/2005 | Aoki | |
| 7,127,695 B2 | 10/2006 | Huang | |
| 7,181,664 B2 | 2/2007 | Lee | |
| 7,188,323 B2 | 3/2007 | Wang | |
| 7,681,165 B2 | 3/2010 | Peters | |
| 7,721,171 B2 | 5/2010 | Erle | |
| 7,818,644 B2 * | 10/2010 | Rajski et al. ................... | 714/732 |
| 7,840,865 B2 * | 11/2010 | Lai et al. ........................ | 714/728 |
| 7,958,472 B2 | 6/2011 | Wohl | |
| 7,996,805 B2 | 8/2011 | Pasqualini | |
| 8,024,693 B2 | 9/2011 | Adams | |
| 8,099,702 B2 | 1/2012 | Hou | |
| 8,584,073 B2 * | 11/2013 | Kapur et al. ................... | 716/136 |
| 2004/0221253 A1 | 11/2004 | Imper | |
| 2007/0022339 A1 | 1/2007 | Branch | |

OTHER PUBLICATIONS

A novel approach to Scan Chain Reordering to minimize On-Chip Variation effects, IP.com Prior Art Database Disclosure No. IPCOM000175571D, dated Oct. 14, 2008.
Robust timing closure in scan shift using sequential gates, Freescale Semiconductor, EDN Asia, Jun. 18, 2012.
Gupta, P., Kahng, A. B., Mantik, S., Routing-aware scan chain ordering, IEEE Proceedings of the ASP-DAC 2003. Asia and South Pacific Design Automation Conference, 2003, Jan. 21-24, 2003, pp. 857-862.

* cited by examiner

*Primary Examiner* — David Ton
(74) *Attorney, Agent, or Firm* — Charles Bergere

(57) ABSTRACT

A system for re-ordering a scan chain of an electronic circuit design using an electronic design automation (EDA) tool includes a processor and a memory in communication with the processor. The scan chain includes a plurality of scan cells. All connections of the scan chain are disconnected. An output port of a first scan cell is connected to input ports of other scan cells to form a first set of scan cell combinations. A first scan cell combination is selected from the first set of scan cell combinations based on weighted averages of ordering parameters of each of the first set of scan cell combinations. The process is repeated to re-order the scan chain.

20 Claims, 4 Drawing Sheets

SYSTEM AND METHOD FOR SCAN CHAIN RE-ORDERING

BACKGROUND OF THE INVENTION

The present invention relates generally to electronic circuit designs, and more particularly to re-ordering of scan chains in electronic circuit designs.

Scan chains in electronic circuit designs include series-connected scan cells that include one or more flip-flops. Scan chains facilitate testing of a circuit such as a system-on-chip (SoC). Test patterns generated using an external test apparatus are provided to a scan input terminal of a scan chain. An output pattern obtained at a scan output terminal of the scan chain is compared with an expected output pattern to identify possible faults in the circuit design.

Scan chains do not have any digital logic elements between successive scan cells, which renders the scan chain susceptible to hold violations. A hold violation occurs when an intended input of a flip flop in a scan chain is changed before an active clock edge reaches the flip flop, resulting in loss of the intended input. Faster flop access times also contribute to hold violations. To avoid hold violations, one or more buffers are added to the scan chain, which increases the time required for a data signal to propagate through the scan chain. Various on chip variations (OCV) also require addition of buffers to the scan chain, which further increases the time required for the data signal to propagate through the scan chain. Furthermore, the addition of buffers increases the area occupied by the scan chain.

Various scan chain re-ordering techniques are used to optimize the time required for the data signal to propagate in a scan chain and reduce the area occupied by the scan chains. Existing scan chain re-ordering techniques re-order scan chains based on scan chain length and clock tree timing parameters. Clock tree timing parameters include various timing parameters, such as insertion delay associated with the clock tree from which clock signals are provided to the scan chain. The existing scan chain re-ordering techniques are not effective for SoCs that have small circuit boards, where in addition to the clock tree timing parameters, on-chip variations such as inter-die variations, aging margins, negative bias temperature instability, and hot carrier injection also affect the timing parameters. Optimizing timing between successive scan cells of the scan chain after factoring in the OCV requires several manual iterations and is a time consuming task. Thus, there is an increasing need to develop a scan chain re-ordering technique that re-orders the scan chains based on all timing parameters and not just the clock tree timing parameters.

Therefore, it would be advantageous to have a system and method that re-orders scan chains based on the length and various timing parameters, that is not time consuming, and that overcomes the above-mentioned limitations of the existing scan chain re-ordering techniques.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
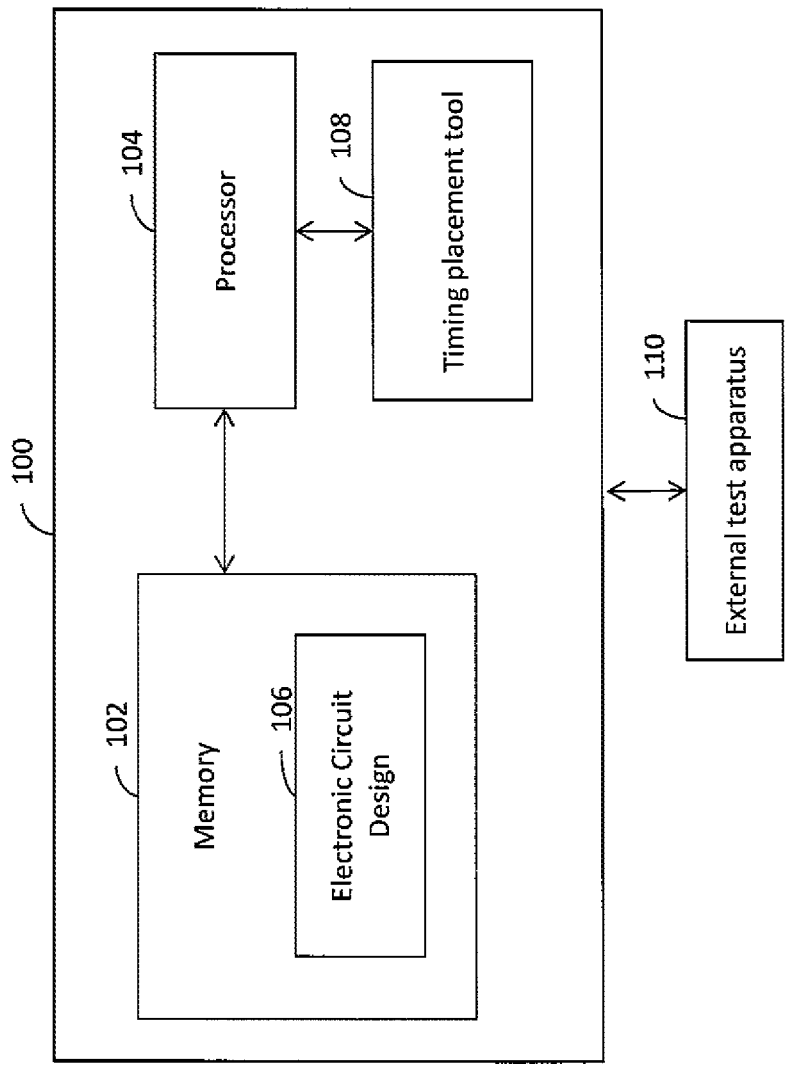
FIG. 1 is a schematic block diagram of an electronic design automation (EDA) tool for re-ordering a scan chain of an electronic circuit design in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for selecting a first scan cell combination from a plurality of scan cells in a scan chain of an electronic circuit design is provided. The method is used for re-ordering the scan chain and is performed using an electronic design automation (EDA) tool executing on a processor. The EDA tool includes a timing placement tool and a memory that stores the electronic circuit design. A first plurality of connections between the plurality of scan cells is disconnected and a first scan cell is identified from the plurality of scan cells. The first scan cell is at least one of a scan cell that receives a test input signal from an external test apparatus and a scan cell that provides an output signal to the external test apparatus. The first scan cell is connected with each of the plurality of scan cells to form a first plurality of scan cell combinations. A plurality of ordering parameters corresponding to each of the first plurality of scan cell combinations is determined using the timing placement tool. At least one weighted average of the plurality of ordering parameters corresponding to each of the first plurality of scan cell combinations is determined. The first plurality of scan cell combinations are arranged based on the at least one weighted average. The first scan cell combination is selected based on a predetermined priority of the plurality of ordering parameters.

Various embodiments of the present invention provide a system and method for re-ordering a scan chain of an electronic circuit design, using an EDA tool executing on a processor. The scan chain includes a plurality of scan cells and is re-ordered by selecting a first scan cell combination from the scan cells. The processor disconnects all connections between the scan cells of the scan chain and identifies a first scan cell that receives a test input signal from an external test apparatus. The processor then connects an output of the first scan cell with inputs of each scan cell to form a first set of scan cell combinations. The processor selects a first scan cell combination from the first set of scan cell combinations based on weighted averages of the ordering parameters of each combination of the first set of scan cell combinations. The selected first scan cell combination includes the first scan cell and a second scan cell. The process is repeated by retaining the connections between the first and second scan cells and by disconnecting the other connections until all scan cells are re-ordered. Unlike existing scan chain re-ordering techniques that re-order scan chains based on clock tree timing parameters and scan chain lengths, the process of the present invention re-orders scan chains based on a slack of each scan cell combination of the scan chain. The slack of a scan cell combination is representative of all timing parameters including clock skew, on chip variations, and additional buffers of the scan cell combination. Thus, re-ordering a scan chain based on the slack of each scan cell combination significantly reduces the time taken for a data signal to propagate through the scan chain and the area that the scan chain occupies. The reduction in the timing and area of the scan chain reduces the power consumed by the SoC.

The present invention gives a user flexibility to assign weights to scan chain ordering parameters including net-length and slack, which enables the user to prioritize the ordering parameters for scan chain re-ordering. In addition, the EDA tool automatically re-orders the scan cells based on the weights assigned by the user, thereby reducing the manual intervention and design closure time of the SoC.

Referring now to FIG. 1, a schematic block diagram of an electronic design automation (EDA) tool for re-ordering a scan chain of an electronic circuit design in accordance with an embodiment of the present invention is shown. The EDA tool 100 includes a memory 102 and a processor 104 in communication with the memory 102. The memory 102 stores the electronic circuit design 106. The electronic circuit design 106 includes scan cells used for scan chain testing of an integrated circuit such as a system on a chip (SoC). A scan cell includes one or more series connected flip flops and the scan cells are series-connected to form scan chains. The EDA tool 100 also includes a timing placement tool 108 that is used to store ordering parameters associated with scan cell combinations of the scan chains. An external test apparatus 110 is connected to the EDA tool 100 and provides a test input signal to the scan chains for scan chain testing of the electronic circuit design 106.

The processor 104 and the memory 102 comprise a computer system that can range from a stand-alone personal computer to a network of processors and memories, to a mainframe system. The computer system must be able to run tools that can simulate digital and analog circuits, such as Cadence® Encounter™ digital IC design platform, Integrated Circuit Compiler (ICC) by Synopsys, Inc., and Olympus SoC by Mentor Graphics, Inc. Such tools and computer systems are known to those of skill in the art. Examples of the electronic circuit design 106 may include design of a microprocessor, a microcontroller unit (MCU), a system-on-chip (SoC), and an application specific integrated circuit (ASIC).

In an embodiment of the present invention, the EDA tool 100 re-orders the scan chain of the electronic circuit design 106. The EDA tool 100 receives the electronic circuit design 106 as an input from a user and stores the electronic circuit design 106 in the memory 102. The processor 104 provides clock signals to the scan cells of the scan chain. The scan chain has a primary input port that receives test input signals from the external test apparatus 110, and a primary output port that provides output signals back to the external test apparatus 110 after the test input signals propagate through the scan cells between the primary input and output ports. The processor 104 disconnects all connections between the scan cells of the scan chain, except for a connection between the primary input port and a scan cell at the beginning of the scan chain and a connection between the primary output port and a scan cell at the end of the scan chain. In an embodiment of the present invention, the user specifies a first scan cell either at the beginning of the scan chain or at the end of the scan chain as the starting point for re-ordering of the scan chain, i.e., it is possible to re-order the scan chain in any direction. The processor 104 connects an output port of the first scan cell to input ports of the other scan cells to form a first set of scan cell combinations. The timing placement tool 108 stores ordering parameters corresponding to each of the first set of scan cell combinations.

The ordering parameters include a clock skew, a slack and a net-length corresponding to each scan cell combination. Clock skew of a scan cell combination is a difference in arrival times of the clock signal at each scan cell of the scan cell combination. Slack of a scan cell combination is representative of the timing parameters including clock skew, on chip variations, and additional buffers of the scan cell combination. The net-length of a scan cell combination is a physical distance between the scan cells.

After forming the first set of scan cell combinations, the processor 104 extracts the ordering parameters corresponding to each combination of the first set of scan cell combinations from the timing placement tool 108. In an embodiment of the present invention, the processor 104 connects the output port of the first scan cell to an input port of a second scan cell and extracts the ordering parameters corresponding to the scan cell combination from the timing placement tool 108. Thereafter, the processor 104 repeats the process for all available combinations by iteratively connecting the scan cells and extracting the corresponding ordering parameters.

In an embodiment of the present invention, a user can assign weights to one or more ordering parameters corresponding to the first set of scan cell combinations. The processor 104 receives the weights from the user and determines weighted averages of the ordering parameters for each combination of the first set of scan cell combinations. Thereafter, the processor 104 selects a scan cell combination with the highest weighted average as a first scan cell combination, which includes the first scan cell and a second scan cell. For instance, the user may select a scan cell combination having highest slack by assigning weights to slack, clock skew, and net-length in decreasing order of magnitude and selecting the scan cell combination having highest weighted average as the first scan cell combination.

In another embodiment of the present invention, the user specifies a predetermined priority to select the first scan cell combination, when two or more scan cell combinations of the first set of scan cell combinations have equal highest weighted averages. For example, the user may specify lowest net-length as the priority. The processor 104 then arranges weighted averages based on their net-lengths and selects a scan cell combination with the least net-length as the first scan cell combination. In various embodiments of the present invention, the user assigns lowest or highest values for slack, clock skew, or net-length as the predetermined priority.

After selecting the first scan cell combination, the processor 104 retains the connection between the first and second scan cells, the connection between the first scan cell and the primary input port, and the connection between the scan cell at the end of the scan chain and the primary output port, and disconnects the connections between the other scan cells. Thereafter, the processor 104 connects an output port of the second scan cell to input ports of the other scan cells to form a second set of scan cell combinations. The processor 104 repeats the above process and selects a second scan cell combination that includes the second scan cell and a third scan cell. Similarly, the processor 104 selects and connects subsequent scan cell combinations, thus re-ordering the scan chain. The processor 104 connects an output port of each scan cell to an input port of only one other scan cell, thus forming a re-ordered, linear chain of scan cells.

In an embodiment of the present invention, the user may provide threshold values for clock skew, slack, and net-length of the scan cell combinations. The processor 104 then selects first scan cell combination from the first set of scan cell combinations based on the weighted averages, the predetermined priority of ordering parameters, and the threshold values of the ordering parameters. For instance, a net-length threshold of 10 nanometers (nm) may be input by the user i.e., the maximum net-length of the first scan cell combination cannot exceed 10 nm.

In an embodiment of the present invention, the processor 104 determines the weighted average of ordering parameters for each scan cell combination of the first set of scan cell combinations, based on net-length and one of clock skew and slack of each scan cell combination. The processor 104 retrieves the ordering parameters from the timing placement tool 108. When the slack of a scan cell combination of the first set of scan cell combinations is positive, the processor 104 determines the weighted averages of each scan cell combination as a function of the clock skew and net-length of the scan cell combination. When the slack of the scan cell combination is negative, the processor 104 determines the weighted average of each scan cell combination as a function of the slack and net-length of the scan cell combination. Theoretically, the relationship between the weighted average and the ordering parameters of a scan cell combination, when the slack is positive, is given by equation (1):

$$\text{Weighted average} = F(\text{clock skew})/G(\text{net-length}) \quad (1)$$

where,
F (clock skew) and G (net-length) are monotonic increasing functions.

Similarly, the relationship between the weighted average and the ordering parameters of a scan cell combination, when the slack is negative, is given by equation (2):

$$\text{Weighted average} = F(\text{slack})/G(\text{net-length}) \quad (2)$$

where,
F (slack) and G (net-length) are monotonic increasing functions.

The processor 104 calculates weighted averages of those scan cells having positive slack. Thereafter, the processor 104 selects the scan cell combination having highest weighted average as the first scan cell combination. If none of the scan cell combinations have positive slack, the processor 104 calculates the weighted averages according to equation (2) and selects the scan cell combination having the highest weighted average as the first scan cell combination. Subsequently, the processor 104 repeats the above mentioned process until all scan cells of the scan chain are re-ordered.

In yet another embodiment of the present invention, the processor 104 forms the first set of scan cell combinations by using brute force algorithm. After disconnecting all connections between the scan cells, the processor 104 connects an input port of each scan cell to an output port of every other scan cell of the scan chain to form the first set of scan cell combinations. The processor 104 then selects the first scan cell combination from the first set of scan cell combinations using the above mentioned process.

Figure 2A:
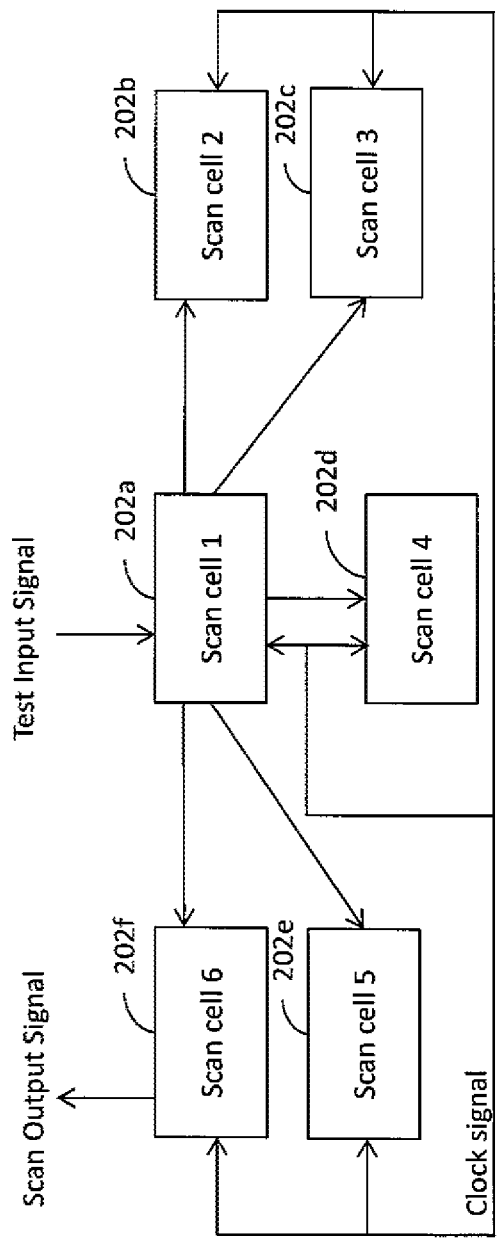
FIG. 2A is a schematic diagram of a scan chain of an electronic circuit design before scan chain re-ordering in accordance with an embodiment of the present invention.

Referring now to FIG. 2A, a schematic diagram of a scan chain of an electronic circuit design before re-ordering, in accordance with an embodiment of the present invention, is shown. FIG. 2A is explained in conjunction with the description of FIG. 1.

The user inputs the electronic circuit design 106 that includes scan cells including first through sixth scan cells 202a-202f (collectively referred to as scan cells 202) connected to each other to form a scan chain. The external test apparatus 110 provides a test input signal to input port of the scan cell 202a. The output signal is retrieved from output port of the scan cell 202f. The processor 104 provides the clock signal to each scan cell 202. The processor 104 disconnects all connections between the scan cells 202 except for the connections between the scan cell 202a and the primary input port and the scan cell 202f and the primary output port. The user specifies scan cell 202a as the first scan cell. The processor 104 connects an output port of scan cell 202a to input ports of scan cells 202b-202e to form the first set of scan cell combinations. The processor 104 retrieves ordering parameters of each of the four scan cell combinations from the timing placement tool 108. The relationship between the weighted average and the ordering parameters is as follows:

$$F(a) = a\hat{\ }(\text{weight of } a) \quad (3)$$

and $$G(b) = y\hat{\ }(\text{weight of } b) \quad (4)$$

Based on equations (3) and (4), when the slack is positive, the weighted average is given by equation (5):

$$\text{Weighted average} = (\text{clock skew})\hat{\ }x/(\text{net-length})\hat{\ }z \quad (5)$$

where,
x—Weight received from the user for clock skew, and
z—Weight received from the user for net-length Similarly, the relationship between the weighted average and the ordering parameters of a scan cell combination, when the slack is negative is given by equation (6):

$$\text{Weighted average} = (\text{slack})\hat{\ }y/(\text{net-length})\hat{\ }z \quad (6)$$

where,
y—Weight received from the user for slack, and
z—Weight received from the user for net-length.

The equations (3) and (4) represent functions defined by the user for calculating the weighted averages based on the ordering parameters. It should be noted that other similar functions may also be used to calculate the weighted averages of the ordering parameters, without departing from the scope of the present invention.

The user assigns weights of 2, 3 and 1 for clock skew, slack and net-length, respectively, for the first set of scan cell combinations. The processor 104 determines weighted averages of the ordering parameters corresponding to each scan cell combination of the first set of scan cell combinations, based on equations (5) and (6) shown above. Table A shows the values of ordering parameters and corresponding weighted averages of the four scan cell combinations.

TABLE A

Ordering parameters and corresponding weighted averages of scan cell combinations

| Scan Cell Combination | Clock skew (picoseconds) | Slack (picoseconds) | Net-length (nanometers) | Weighted average |
|---|---|---|---|---|
| 202a-202b | 3 | 2 | 3 | 3 |
| 202a-202c | −2 | 3 | 1 | −4 |
| 202a-202d | 2 | −2 | 2 | −4 |
| 202a-202e | 2 | 3 | 2 | 2 |

Thereafter, the processor 104 identifies scan cell combination 202a-202b as having the highest weighted average of ordering parameters and selects scan cell 202a-scan cell 202b as the first scan cell combination.

Figure 2B:
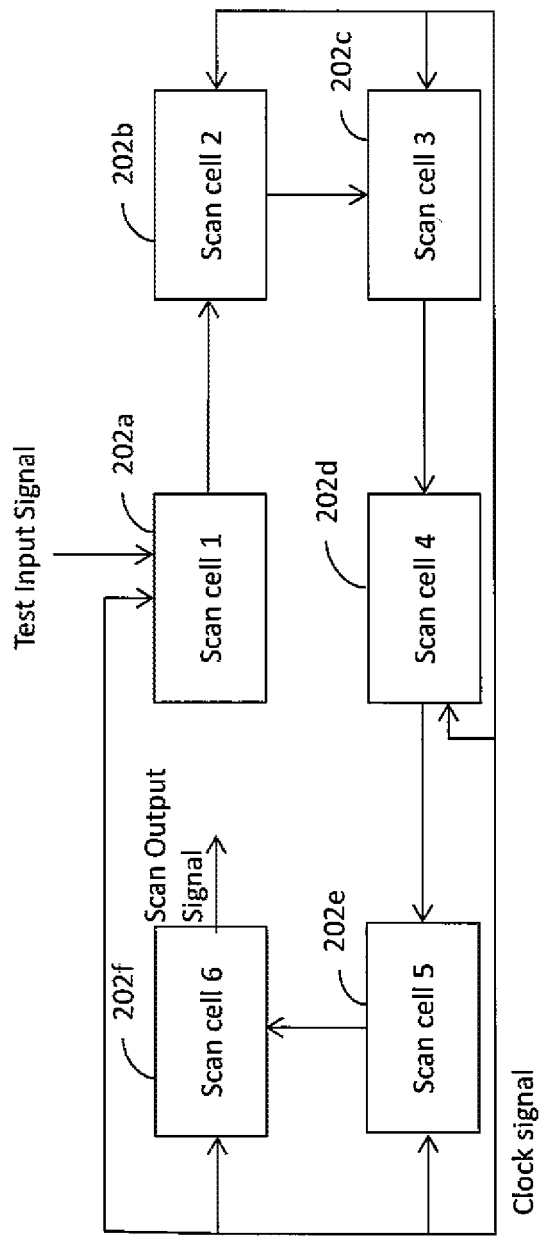
FIG. 2B is a schematic diagram of a re-ordered scan chain of an electronic circuit design in accordance with an embodiment of the present invention.

Referring now to FIG. 2B, a schematic diagram of a re-ordered scan chain of an electronic circuit design, in accordance with an embodiment of the present invention, is shown. FIG. 2B is described in conjunction with the description of FIG. 1 and FIG. 2A.

After selecting the scan cell 202a-scan cell 202b as the first scan cell combination, the processor 104 repeats the above process and selects scan cell 202b-scan cell 202c, scan cell 202c-scan cell 202d, scan cell 202d-scan cell 202e and scan cell 202e-scan cell 202f as subsequent scan cell combinations, thus re-ordering the scan chain shown in FIG. 2A. The re-ordered scan chain is shown in FIG. 2B.

Figure 3:
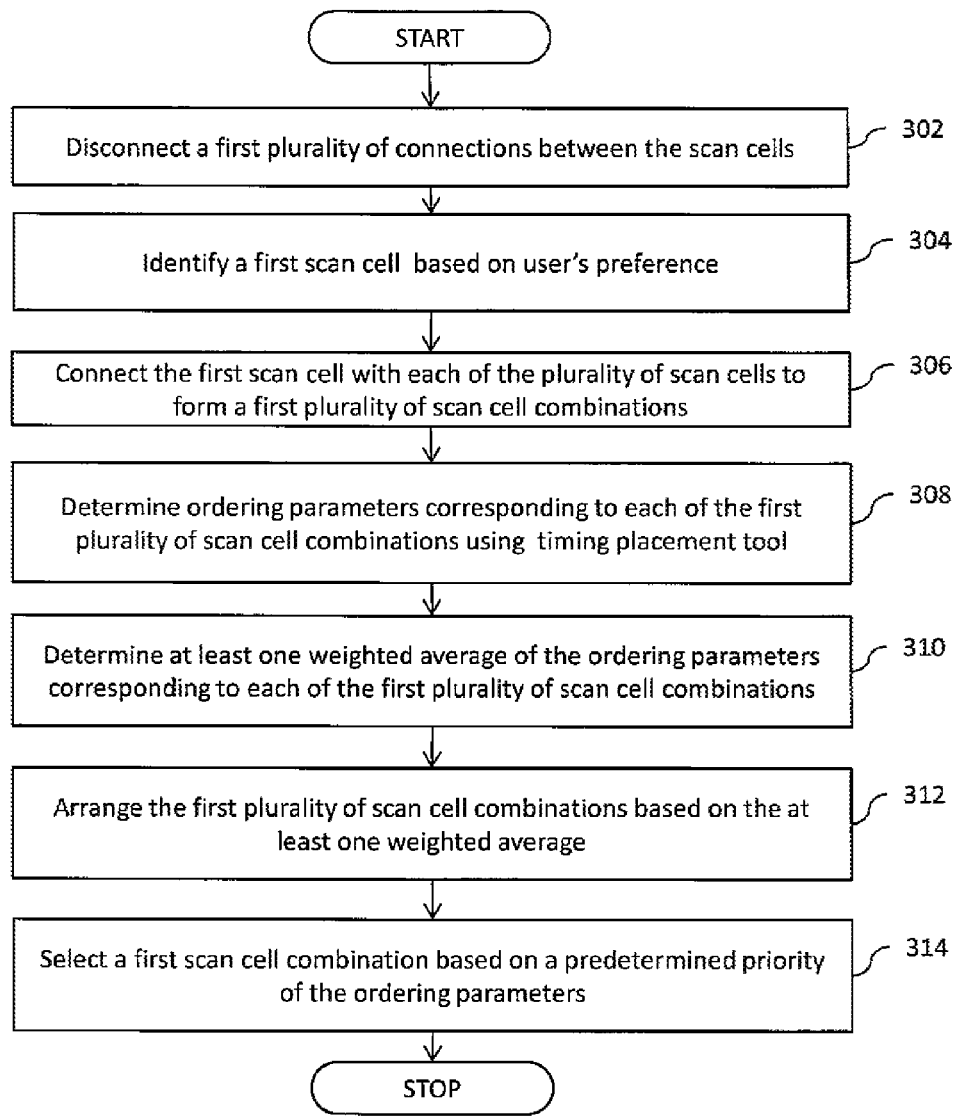
FIG. 3 is a flowchart illustrating a method for re-ordering a scan chain of an electronic circuit design in accordance with an embodiment of the present invention.

Referring now to FIG. 3, a flowchart illustrating a method for re-ordering a scan chain of an electronic circuit design, in accordance with an embodiment of the present invention, is shown. The steps of FIG. 3 are explained in conjunction with the description of FIG. 1, FIG. 2A and FIG. 2B. The EDA tool 100 receives the electronic circuit design 106 as an input from the user. At step 302, the processor 104 disconnects all connections between the scan cells of the scan chain except for the connection between the primary input port and the scan cell at the beginning of the scan chain and the connection between the primary output port and the scan cell at the end of the scan chain. At step 304, the processor 104 identifies the first scan cell, based on user's preference. Thereafter, at step 306, the processor 104 connects the output port of the first scan cell with the input ports of each of the scan cells of the scan chain to form the first set of scan cell combinations. At step 308, the processor 104 retrieves the ordering parameters of each of the first set of scan cell combinations from the timing placement tool 108.

The processor 104 then determines weighted averages of the ordering parameters corresponding to each of the first set of scan cell combinations at step 310. Thereafter, at step 312, the processor 104 arranges the first set of scan cell combinations based on their weighted averages. Finally, at step 314, the processor 104 selects a scan cell combination having the highest weighted average as the first scan cell combination. The processor 104 repeats steps 302-314 until all scan cells of the scan chain are re-ordered.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An electronic design automation (EDA) tool for selecting a first scan cell combination from a plurality of scan cells in a scan chain of an electronic circuit design for re-ordering the scan chain, the EDA tool comprising:

a timing placement tool that provides a plurality of ordering parameters corresponding to each combination of two scan cells of the plurality of scan cells;

a memory that stores the electronic circuit design; and a processor in communication with the memory, wherein the processor is configured for:

disconnecting a first plurality of connections between the plurality of scan cells;

identifying a first scan cell from the plurality of scan cells, wherein the first scan cell is at least one of a scan cell that receives a test input signal from an external test apparatus and a scan cell that provides an output signal to the external test apparatus;

connecting the first scan cell with each of the plurality of scan cells to form a first plurality of scan cell combinations;

determining a plurality of ordering parameters corresponding to each of the first plurality of scan cell combinations using the timing placement tool;

determining at least one weighted average of the plurality of ordering parameters corresponding to each of the first plurality of scan cell combinations;

arranging the first plurality of scan cell combinations based on the at least one weighted average; and selecting the first scan cell combination based on a predetermined priority of the plurality of ordering parameters.

2. The EDA tool of claim 1, wherein the first scan cell combination includes the first scan cell and a second scan cell.

3. The EDA tool of claim 2, wherein the processor further performs the step of re-ordering the first and second scan cells by selecting the first scan cell combination.

4. The EDA tool of claim 3, wherein the processor further performs the step of disconnecting a second plurality of connections between the first plurality of scan cell combinations excluding the first scan cell combination.

5. The EDA tool of claim 4, wherein the processor further performs the step of connecting the second scan cell with each of the plurality of scan cells to form a second plurality of scan cell combinations.

6. The EDA tool of claim 2, wherein the processor further performs the step of selecting the first scan cell combination based on a length threshold, a clock skew threshold, and a slack threshold.

7. The EDA tool of claim 3, wherein the length threshold, the clock skew threshold, and the slack threshold correspond to maximum values for the net-length, the clock skew, and the slack, respectively.

8. The EDA tool of claim 1, wherein the plurality of ordering parameters includes at least one of clock skew, slack, and net-length corresponding to each of the plurality of scan cell combinations.

9. The EDA tool of claim 1, wherein the processor further performs the step of constructing the first plurality of scan cell combinations by iteratively connecting the first scan cell to each of the plurality of scan cell combinations and determining a plurality of ordering parameters corresponding to each iterative connection of the first scan cell with each of the plurality of scan cells after each iterative connection of the first scan cell with each of the plurality of scan cells.

10. The EDA tool of claim 1, wherein, the processor selects the first scan cell combination using a brute force algorithm.

11. A method for selecting a first scan cell combination from a plurality of scan cells in a scan chain of an electronic circuit design for re-ordering the scan chain using an electronic design automation (EDA) tool executing on a processor, wherein the electronic design automation tool includes a timing placement tool and a memory for storing the electronic circuit design, the method comprising:

disconnecting a first plurality of connections between the plurality of scan cells;

identifying a first scan cell from the plurality of scan cells, wherein the first scan cell is at least one of a scan cell that receives a test input signal from an external test apparatus and a scan cell that provides an output signal to the external test apparatus;

connecting the first scan cell with each of the plurality of scan cells to form a first plurality of scan cell combinations;

determining a plurality of ordering parameters corresponding to each of the first plurality of scan cell combinations using the timing placement tool;

determining at least one weighted average of the plurality of ordering parameters corresponding to each of the first plurality of scan cell combinations;

arranging the first plurality of scan cell combinations based on the at least one weighted average; and selecting the first scan cell combination based on a predetermined priority of the plurality of ordering parameters.

12. The method of claim 11, wherein the first scan cell combination includes the first scan cell and a second scan cell.

13. The method of claim 12, wherein the first and second scan cells are re-ordered by selecting the first scan cell combination.

14. The method of claim 13, further comprising disconnecting a second plurality of connections between the first plurality of scan cell combinations excluding the first scan cell combination.

15. The method of claim 14, further comprising connecting the second scan cell with each of the plurality of scan cells to form a second plurality of scan cell combinations.

16. The method of claim 11, wherein the plurality of ordering parameters includes at least one of clock skew, slack, and net-length corresponding to each of the plurality of scan cell combinations.

17. The method of claim 16, wherein the first scan cell combination is selected based on a length threshold, a clock skew threshold, and a slack threshold.

18. The method of claim 17, wherein the length threshold, the clock skew threshold, and the slack threshold correspond to maximum values for the net-length, the clock skew, and the slack, respectively.

19. The method of claim 11, wherein the first plurality of scan cell combinations is constructed by iteratively connecting the first scan cell to each of the plurality of scan cell combinations and determining a plurality of ordering parameters corresponding to each iterative connection of the first scan cell with each of the plurality of scan cells after each iterative connection of the first scan cell with each of the plurality of scan cells.

20. The method of claim 11, wherein the first scan cell combination is selected using a brute force algorithm.

* * * * *